United States Patent [19]

Churchward et al.

[11] Patent Number: 4,691,303

[45] Date of Patent: Sep. 1, 1987

[54] REFRESH SYSTEM FOR MULTI-BANK SEMICONDUCTOR MEMORY

[75] Inventors: Reed R. Churchward, Apple Valley; Thomas L. Krocheski, Burnsville, both of Minn.

[73] Assignee: Sperry Corporation, Blue Bell, Pa.

[21] Appl. No.: 793,519

[22] Filed: Oct. 31, 1985

[51] Int. Cl.[4] .................................. G11C 13/00
[52] U.S. Cl. .................................. 365/222; 365/189
[58] Field of Search .................. 365/222, 200, 189; 371/11

[56] References Cited

U.S. PATENT DOCUMENTS

| | | | |
|---|---|---|---|
| 3,737,879 | 6/1973 | Greene et al. | 365/222 |
| 4,183,096 | 1/1980 | Cenker et al. | 365/222 |
| 4,207,618 | 1/1980 | White, Jr. et al. | 365/222 |
| 4,218,764 | 8/1980 | Furuta et al. | 365/222 |
| 4,238,842 | 12/1980 | Aicheimann, Jr. | 365/222 |
| 4,241,425 | 12/1980 | Cenker et al. | 365/222 |
| 4,292,676 | 9/1981 | Henig | 365/222 |
| 4,293,931 | 10/1981 | Tanaka et al. | 365/222 |
| 4,293,932 | 10/1981 | McAdams | 365/222 |
| 4,296,480 | 10/1981 | Eaton, Jr. et al. | 365/222 |
| 4,313,180 | 1/1982 | Mochizuki et al. | 365/222 |
| 4,328,566 | 5/1982 | Thaler | 365/222 |
| 4,333,167 | 6/1982 | McElroy | 365/222 |
| 4,334,295 | 6/1982 | Nagami | 365/222 |
| 4,344,157 | 8/1982 | White, Jr. et al. | 365/222 |
| 4,347,589 | 8/1982 | Proebsting | 365/222 |
| 4,357,686 | 11/1982 | Scheuneman | 365/222 |
| 4,360,903 | 11/1982 | Plachno et al. | 365/222 |
| 4,376,988 | 3/1983 | Ludwig et al. | 365/222 |
| 4,528,665 | 7/1985 | Burns et al. | 365/222 |

OTHER PUBLICATIONS

A. R. Basilico & R. M. Dinkjian, FET Memory with Hidden Refresh, IBM Technical Disclosure Bulletin, vol. 25, No. 7A, Dec. 1982, p. 3182.
D. A. Canton, Refresh Logic Control, IBM Technical Disclosure Bulletin, vol. 22, No. 3, Aug. 1979. pp. 1206–1207.
M. Kerrigan, et al, Dynamic Memory Refresh Sequence for Asynchronous Processor, IBM Technical Disclosure Bulletin, vol. 22, No. 5, Oct. 1979, p. 1883.
L. C. Eggebrecht, Reduced Program Overhead for Software-Generated Dynamic Memory Refresh, IBM Technical Disclosure Bulletin, vol. 23, No. 3, Jul. 1980, pp. 468–469.
D. W. Grimes, et al, Memory Refreshes During an Access Cycle Lock-up, IBM Technical Disclosure Bulletin, vol. 25, No. 8, Jan. 1983, pp. 4275–4278.

Primary Examiner—Terrell W. Fears
Attorney, Agent, or Firm—Glenn W. Bowen; Laurence J. Marhoefer

[57] ABSTRACT

Refresh signals for a multiple semiconductor MOS bank memory are implemented with a refresh counter that supplies 15.6 microseconds refresh pulses so that one row of 128 row of memory bank, or of each of a group of memory banks, may be refreshed on a sequential, stepped-through basis. The occurrence of each refresh pulse is effective to refresh one row or a group of rows, providing that refresh lock-out logic does not prevent the refresh pulses signals from being applied to the memory banks. An up/down counter is initially filled to a count of eight, and counts toward zero once each time a refresh pulse occurs and the memory is busy. As long as the count has not reached zero the lock-out logic is effective, but when a count of zero occurs refresh of each new row in the sequence occurs at the 15.6 microsecond rate until the memory is no longer busy; at which time a burst of eight count up pulses is supplied to the up/down counter, and eight new rows are rapidly refreshed at 450 nanosecond intervals. If the memory becomes not busy for a short period of time, such that the entire group of eight refreshes has not been completed, the counter 96 will stop at an intermediate level (between counts of "0" and "8") and will continue honoring priority requests.

4 Claims, 5 Drawing Figures

REFRESH SYSTEM FOR MULTI-BANK SEMICONDUCTOR MEMORY

The U.S. Government has a paid-up license in this invention and the right in limited circumstances to require the patent owner to license others on reasonable terms as provided for by the terms of contract No. N00024-80-C-7359 awarded by the Navy.

BACKGROUND OF THE INVENTION

This invention relates to a system for refreshing dynamic memories, and more particularly, to a system for refreshing a semiconductor memory by writing into memory locations whose row addresses are determined by a refresh counter, in a manner which expands the time the memory may operate without reserving a memory cycle for the refreshing operation.

Various techniques are used to refresh dynamic semiconductor memories to keep data from being lost as a result of the leakage of charge from memory cells over a period of time. Generally a refresh cycle is used to periodically restore the charge back to its initial value by operating on one row of memory at a time, or on groups of several rows which are a very small fraction of the total number of rows of the memory.

Typically all of the rows of a semiconductor memory must be refreshed in about two milliseconds before any row needs to be refreshed again. The addresses of the row being refreshed are accessed by a refresh cycle which contains a count that keeps track of the row that was the most recently refreshed. When the counter is incremented it refreshes the next row in the sequence of the refresh cycle. An example of a refresh counter for such a system is shown in U.S. Pat. No. 4,347,589 issued Aug. 31, 1982 to Robert J. Proebsting, which is entitled "Refresh Counter Test".

The memory cells of a dynamic metal oxide semiconductor memory (MOS) requires a significantly smaller area compared to a static MOS memory, which reduces the costs of implementing dynamic MOS memories. The operating power requirements of a dynamic MOS memory are also generally significantly lower, but very large scale dynamic semiconductor memories in the range of 512K to 2 M words still have significantly high enough power requirements that only a very small number of the rows of the memory may be refreshed at any given time, in order to conserve refresh power.

For example in a memory 8 banks of 256K words, there may be 128 rows. In order to keep power requirements to a reasonable level, the number of rows that are refreshed at any given time must be limited, for example one row of each of the 8 banks may be refreshed at a given time within reasonable power restrictions. However, with this relatively large number of rows, and the relatively few rows which may be refreshed at any given time, the potential increases for conflicting refresh and memory access requests by a requesting device.

In U.S. Pat. No. 4,376,988 issued Mar. 15, 1983, to Volker Ludwig, et al, entitled "Method and Circuitry Arrangement for Refreshing Data Stored in a Dynamic MOS Memory", a memory with 128 lines and 128 columns, which requires memory cell refreshing every two milliseconds, is disclosed. In this system, each line is refreshed after 15.6 microseconds. The refreshing process itself lasts approximately 450 nanoseconds. In the described memory of this patent, the longest memory cycle was a write process which lasted approximately 1.7 microseconds.

In order to obtain a refreshing cycle of 15.6 microseconds with the maximum possible write process delay, the refresh time was shortened to 12.5 microseconds. Large scale data processing systems using memories on the order of 256K words, advantageously use architecture which requires memory cycles that vary from normal operating cycle of 450 nanoseconds to up to 10 microseconds. With the system of the Ludwig, et al, patent, a refresh would have to occur every 2 or 3 microseconds to accommodate a memory cycle of 10 microseconds which would be impractically short for this type of architecture.

Two commonly used types of system for the refreshing of semiconductor memory systems are the "burst mode" and the "interleaved mode". In the burst mode all, or some major segment of the memory, is refreshed as required, and all accessing for reading or writing of the memory is temporarily interrupted. In the interleaved mode the control circuitry determines the times of operation when access to the memory is not available for either reading or writing. During such times the system will be free to refresh the memory cells. Thus an activated read or write will not be interrupted, but refresh cycles will be interleaved with the read and write cycles on a non-interfering basis.

Interleaving of refresh cycles, however, may not by itself provide sufficient access at times to the memory system to satisfy the refresh requirement interval for all memory cells. In such event, the reading and writing functions may have to be interrupted to complete the refresh of the entire memory system. The interleaving technique generally minimizes the time that is required by the system simply to refresh the memory. However, prior implementations of such a technique have often resulted in excessive circuit requirement to accommodate the "least recently used" criteria.

U.S. Pat. No. 4,357,686 issued Nov. 2, 1982 to James H. Scheuneman entitled "Hidden Memory Refresh" described a memory which employed a dedicated refresh flag memory, which has a flag bit associated with each row of the system memory array, and circuitry for writing into the memory for reading each refresh flag, and for refreshing only those rows that were not accessed during the operating period. An alternate embodiment was also described, in which a refresh operation was performed in an interleaved mode where high and low priority periods were established so that the refresh operation was either optional or mandatory in accordance with the priority, and depending on whether or not the memory was active. Both of these described embodiments of U.S. Pat. No. 4,357,686, however, required a refresh flag memory for each row of a memory array.

A memory refresh technique for refreshing a semiconductor memory is described in "FET Memory with Hidden Refresh" by A. R. Basilico and R. M. Dinkjian; IBM Technical Disclosure Bulletin Vol. 25, No. 7A December 1982. The resettable, single-direction up counter described in this article controls the minimum time between successive refresh operations by inhibiting refresh during the first eight counts of counter after a refresh, allows a refresh to occur during the next seven counts only if the memory is not busy, and dictates that a mandatory refresh shall occur at a count of fifteen, at which count the counter is full. The purpose of this technique was to establish the minimum refresh time during periods when the memory was not heavily used.

The present invention provides a system in which a large capacity semiconductor memory may be refreshed in a manner which maximizes the operating time of the memory between refresh cycles, and at the same time allows for variable read-write memory access times.

SUMMARY OF THE INVENTION

The present invention is directed to a semiconductor refreshing the system for large scale semiconductor dynamic memories on the order of 512K to 2M words. These memories typically involve a number of banks of 128 rows and 128 columns each, wherein refreshing is done one row at a time in any given memory bank in order to save power. Typically the maximum time that may be allowed before refreshing is required will be two milliseconds. For 128 rows on a memory, therefore, the maximum refresh cycle time will be 15.6 microseconds per row, since 128 rows times 15.6 microseconds equals 1996.8 microseconds.

A read-write nominal access memory cycle is on the order of 450 nanoseconds for such a memory, but certain memory cycles may require up to 10 microseconds for complicated associated data processing. In the system of the present invention the maximum memory access time of 10 microseconds in a large fraction of the normal refresh time of 15.6 microseconds.

In order to allow for such relatively long memory access cycle times, and to prevent the refresh cycle requirements from unduly interfering with the access to the memory for normal reading and writing, a stockpile counter is employed which "stores" up to eight refresh cycle counts. During times that the memory is "busy", (i.e. while a requestor device is requesting memory access for either reading or writing), the counter counts down toward zero. Thus, if a refresh request occurred immediately prior to the time that the memory became busy, the next refresh requests at 15.6 microseconds apart are ignored, for as long as the memory remains busy up to a total of eight. However, upon the occurrence of the ninth refresh request, refreshing becomes mandatory and continues every 15.6 microseconds as long as the memory remains busy. If the memory becomes not busy before a zero count is reached, it counts back toward a count of eight at a 450 nanosecond rate.

With this timing cycle, there will be a delay period of up to 125 microseconds, during which time if the memory remains busy the refresh requests will be initiated, but ignored, until such time that the counter that stores the refresh bank has counted down to zero, at which count refreshing becomes mandatory. Over this 125 delay period, which may last up to 125 microseconds, therefore, there will be no conflict between use of the memory by the requesting apparatus and the refreshing system. If the counter reaches a count of zero and the memory is busy, refreshing will continue at the 15.6 micro second period as long as the memory remains busy, and afterwards will refresh at a 450 nanosecond rate until either eight refresh cycles have occurred, or the memory again becomes busy.

The delay period of uninterrupted access of the memory for reading and writing that is provided by the present invention, substantially expands the window during which the memory must interrupt requestor access for refresh purposes.

BRIEF DESCRIPTION OF THE DRAWINGS

The refresh system of the present invention is illustrated by reference to the drawings in which.

DESCRIPTION OF THE INVENTION

Figures 1, 1A:
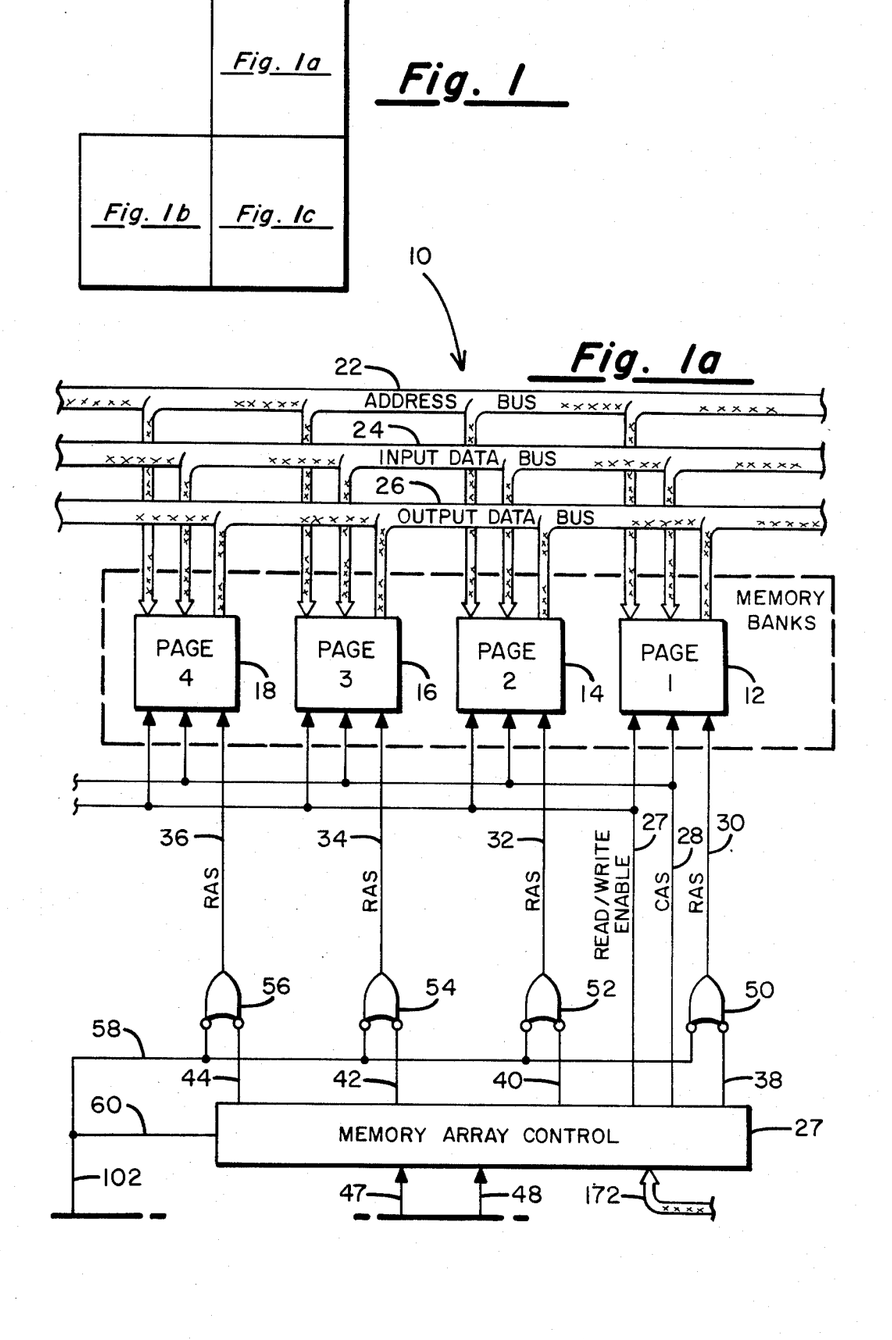
FIG. 1 is a layout sheet which indicates how FIGS. 1a, 1b and 1c should be located with respect to one another to form a complete schematic block diagram of the present invention.
FIG. 1a illustrates the portion of the block diagram of the present invention which shows the address, input data and output data buses, the memory array control, and the pages of the dynamic semiconductor memory bank.
Figure 1B:
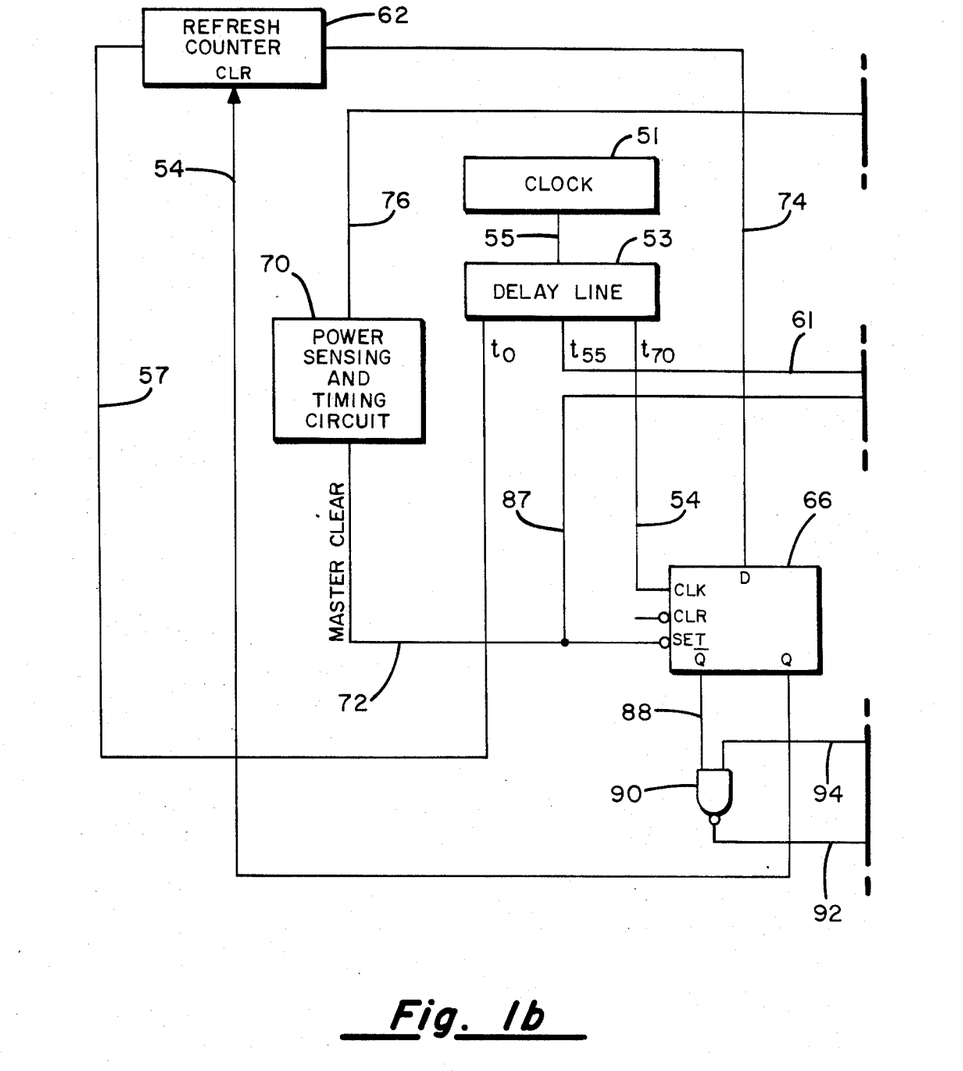
FIG. 1b illustrates the portion of the block diagram schematic of the present invention which shows the clock the refresh counter, control circuitry, and a power sensing and timing circuit which generates power-up control signals.
Figure 1C:
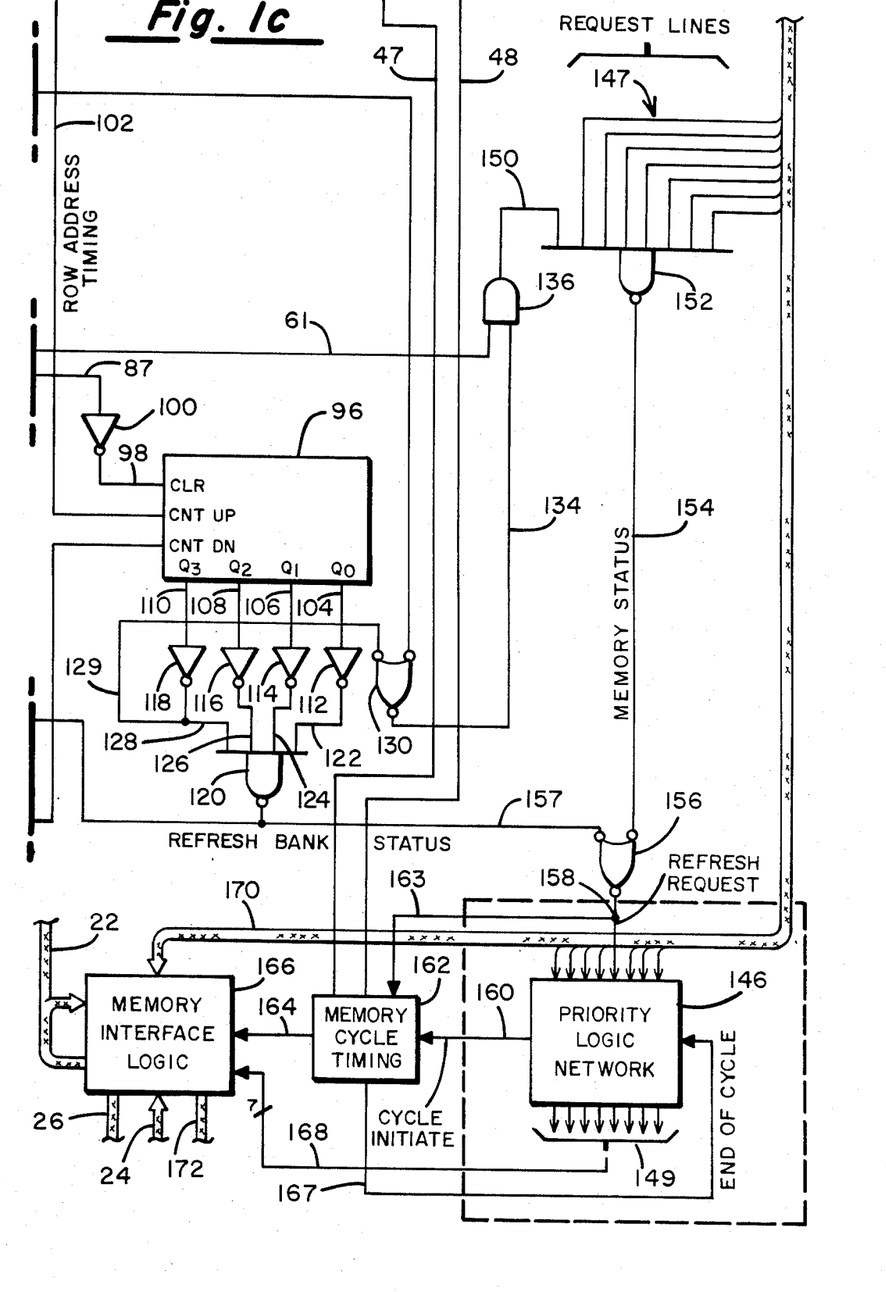
FIG. 1c illustrates the portion of the block diagram which shows the up/down stockpile counter, logic which controls the generation of refresh bank status signals that are utilized to control the refreshing system, and the priority logic memory interface logic and memory cycle timing circuits.

The present invention is illustrated by reference to the drawings which FIG. 1 illustrates how the schematics of FIGS. 1a, 1b and 1c are to be positioned with respect to each other, to form a complete block diagram of the system. As illustrated, FIG. 1b is positioned adjacent and to the left of FIG. 1c, while FIG. 1a is positioned adjacent to and above FIG. 1c.

In the described embodiment of the present invention, the memory and refresh system 10 utilizes four memory banks 12-18 which are arranged as pages 1, 2, 3 and 4 of the memory system. While the illustrated number of pages are four, it is understood that a greater or lesser number pages could be employed in the memory. In the described embodiment it is preferred that the memory banks have a relatively large number of rows and columns, for example on the order of 128 each, so that each page of memory bank will have 65,536 memory cells and comprises what is commonly termed a 64K memory plane (K being equal to 1024).

The pages 1-4 of the memory banks 12-18 may be accessed and data may be supplied from, and to, such banks in a conventional manner by remote circuitry, (not shown), which is connected to the address bus 22, the input data bus 24, and the output data bus 26. Input data will be provided to the memory on the input data bus 24, while output data is supplied from the memory to the output data bus 26. The pages 1-4 of the memory banks 12-18 that are shown in FIG. 1a contain the conventional row address and column address latches, and the necessary decoding and multiplexing gates that are required by the memory. Normal read and write access to the memory for the input and output data buses, therefore, is controlled by external address signals which appear on the address bus 22.

Writing into the memory pages 1-4 of memory banks 12-18 and reading from these pages may also be achieved by utilization of the internally generated Row Address Strobe (RAS), and Column Address Strobe (CAS) signals in conjunction with the Read/Write Enable signal (R/W). For example, when the R/W signal is at a write level it signifies a write condition, and if RAS and CAS signals are also at their active logic levels, writing into the particular specified memory cell may occur. With this arrangement a background pattern of information may be written into the memory banks during the initial power-up stage after activation of power to the system has occurred under control of the internally generated RAS and CAS signals. The level of the R/W signal on the line 22 is controlled by the memory array control 24.

When the R/W signal on the line 22 is in at its read level, reading can occur into a selected cell. Reading and writing may thus be enabled by the line 22 under control of the address that specified on the address bus 22 or by the CAS signal on the line 28, combined with an RAS signal on the lines 30, 32, 34 and 36 which are individually supplied to the memory banks, 12, 14, 16 and 18, respectively. The CAS signal on the line 28 is supplied directly by memory array control 27. The RAS signals on the lines 30–36, are generated under the control of the memory array control which places signals on the lines 38–44.

Reading or writing into a specified cell can be controlled by supplying a read logic level signal on the line 24 and CAS and RAS signals which are associated with a particular memory cell, under the control of the memory array control 27. One of the lines 38–44 will be at a low logic level and the output of the selected one of the negative input OR gates 50–56 will go to a low logic level when the memory array control 26 supplies a timing pulse on that line, thus selecting one of the gates 50–56 and one of the lines 30–36.

When a refresh cycle is desired, the row address strobe or RAS signals, on each of the lines 30–36 may also be initiated on a sequential stepped basis by the row address timing line 48 each time the line 48 goes to a low state a new row memory receives a RAS signal. The line 48, therefore, causes the memory array control 27 to refresh the selected row of each of the pages 1–4 of the memory banks 12–18 simultaneously. This is accomplished by control lines 48 causing 60 and 58 to go low to bring all of the rows 30–36 high simultaneously. A sequential counter in the memory array control keeps track of the last row that was refreshed, so that each time a refresh cycle occurs there is a stepping of the counter to a new row of the memory so that all 128 rows of each of the memory banks of the memory will be refreshed during a two millisecond refresh period. Thus, during the refresh cycle for the memory all of the lines 38–44 will be driven to a high state, which will result in a low active signal appearing on the outputs of the OR gates 50–56, at the time that the timing signal appears on the line 58.

In dynamic semiconductor (MOS) memories, the necessity for refreshing the memory occurs because there is a leakage current from the charge which is stored to represent the logic levels. Refreshing in such a memory generally occurs under the control of either a column address strobe or a row address strobe. In the preferred embodiment of the present the RAS has been selected to control the refreshing of an entire row of each bank of the memory. Since this conforms to conventional design other arrangements within the scope of the present invention may be employed with different designed memories.

Operation of the refresh cycle is such that when an RAS signal occurs, the same numbered row of each of the pages 1–4 of the memory banks 12–18 is selected, and a read logic level signal is placed on the R/W line 24. All of the selected rows of memory cells will thus supply their contents to internal nodes in their respective memory banks. The RAS signal then remains in a low or active state, but the R/W signal changes to its write logic level. This causes a rewriting of the temporarily stored data at the internal nodes back into the memory cells of the selected rows. In this manner, the selected rows are refreshed so that all of the memory banks 12–18 are refreshed during the allowable 2 millisecond refresh cycle.

The refresh counter 62 is a repetitive counter which recycles every 15.6 microseconds on a continuing basis in response to the Clock 51. The Clock 51 is connected to the delay line 53 on the line 55. The $t_o$ or undelayed output of the delay line 53, is coupled on the line 57 to the input of refresh counter 62. The Clock 51 produces 20 nanosecond wide pulses every 150 nanoseconds. The counter 62 supplies the necessary refresh timing signals so that all 128 rows of a given memory bank may be refreshed during the two millisecond time period. The refresh counter 62 is initially cleared by a signal that appears on the clear line 64 from the Q output of the D type flip-flop 66. The input of the active low Clear (CLR) terminal of this flip-flop is not connected, and thus, has a high logic signal on it at all times.

The power sensing and timing circuit 70 initially supplies low logic level signals on the Master Clear line 72 and on the memory backup delay line 76 when the power to the unit is turned on. The power and sensing timing circuit senses when the power supply has reached a sufficiently stabilized level so that transients will not disturb operation of the system. It then supplies a high logic level signal on the Master Clear line 72. The low logic level on the line 72, that occurs when the power to the unit is first turned on, is supplied to the low active Set input of the flip-flop 66, to set this flip-flop. The low logic level on the line 76 is held until a predefined back up memory pattern has been written into memory to insure proper initial operation. This back up memory write may be achieved in a conventional manner in accordance with well-known techniques. The flip-flop 66 will then remain in its set state until the power sensing and timing circuit 70 senses that the power supply has reached a stabilized level, at which time the Master Clear signal on the line 72 will go to a high logic level.

The output line 74 of the refresh counter is coupled to the D input of the flip-flop 66. A low level on the line 74 will clear the flip-flop 66 which causes a low logic level signal to appear on the $\overline{Q}$ output on the line 88 to one input of the NAND gate 90. The Clock input of the flip-flop 66 is coupled to tap $t_{70}$, of the delay line 53 via the line 59, so it receives a clocking pulse that is delayed by seventy clock phases, or approximately 70 nanoseconds from the $t_o$ tap. This delay is provided to allow for stabilization of circuit elements and for timing requirements. The flip-flop 66, will be cleared the next time that a clock pulse is received from the delay line 53 on the line 59. The line 94 to the other input of the NAND gate 90 thus controls the passage of pulses through the gate 90 to the line 92. The line 92 is coupled to the Count Down (CNT DN) terminal of the up/down counter 96.

The purpose of the up/down counter 96 is to control the stockpiling of memory refresh counts. During the initial power-on timing period when the line 88 is at a low logic level, the line 92 to the up/down counter 96 will, therefore, not supply pulses to the counter during the power-on stage. Instead, the row address timing signal that is supplied by the line 102 to the Count Up (CNT UP) terminal, which is connected to the line 60 of the memory array control 27, will cause the counter 96 to count up to its maximum count, (which in the described embodiment is eight), during the power-on timing period. The counter 96 is cleared by the Master Clear signal on the line 87, which is inverted by the inverter 100, and is supplied on the line 98 as a Master Clear signal on power-up.

Initially when the counter 96 is cleared, all of the output stages $Q_0$-$Q_3$ will be at a low logic level. These outputs are respectively supplied on the lines 104–110 to the inverters 112–118. The output of the inverters are coupled on the lines 122–128 to the inputs of a four input NAND gate 120. Thus, initially when the count in the counter 96 is "0" all of the inputs to the NAND gate 120 will be at a high logic level, or a "1" logic level, and the output of the NAND gate 120 will supply a low logic level signal on the line 94. When the line 94 goes to a low logic level, the output of the NAND gate 90 will supply high logic level on the line 92 to the Count Down input of the counter 96. The line 94 will be at a high logic level at all times except when the counter 96 is reset to a "0" count. This means that the pulses that are supplied on the line 92 to the up/down counter 96 will cause it to count down whenever the counter 96 contains a count that is not "0". When the count reaches "0", the line 94 goes low which prevents further pulses from passing through the gate 90.

Since the counter 96 is a four state counter which is capable of counting up to sixteen counts, it is necessary to determine when the count has reached the count of eight. This is achieved by supplying the output of the inverter 118 which is connected to the $Q_3$ output, via the line 129, to one input of the OR gate 130. The OR gate 130 will supply a high logic level signal on its output line 13 whenever either the input on the line 129, or the input on the line 76, is at a high logic level. The first time that the OR gate 130 supplies a high level signal, therefore, occurs at the time the line 76 goes to a high logic level after power-up. Subsequent high logic level signals are supplied on a line 134 each time the count in a counter 96 reaches a count of "8", due to the high logic level that appears on the line 129 when this occurs.

Each time a high logic level signal appears on the line 134 it is coupled to one input of the AND gate 136, the other input of which is connected via the line 61 to the tap $t_{55}$ of the delay line 53 to receive the 450 nanosecond rate Clock pulses from the Clock 51 after a delay of approximately 55 nanoseconds. During the time period between pulses of the refresh counter, up to eight pulses are generated if the memory remains not busy. The output of the AND gate 136 is a supplied on the line 150 to one input of a multiple input NAND gate 152. The other inputs of the NAND gate 152 are supplied on the lines 147 as request signals from remote priority requestors (not shown) which are requesting access to the memory.

As long as there are no active requests by any of the remote requestors, all of the lines 147 will remain at a high logic level, and the output of the NAND gate 152 will follow the pulses that are supplied on the line 150. A burst of up to eight pulses may then be supplied through the AND gate 136, the lines 61 and 150, and the NAND gate 152 to the memory status line 154 when the counter 96 has counted down to "0". The memory status line 154 supplies one input of the OR gate 156, and the other input of this gate is connected to the line 157, which is supplied by the output of the NAND gate 120, so that when the count in the counter 96 reaches a count of "0", the line 157 will go to a low level.

The request lines 147 for the requestor devices are also supplied to the priority logic network 146, which may be any suitable type of network that is capable of assigning access priorities for the requestors. The priority output lines 149 of the priority lock network are supplied to the memory interface 166, in the seven wire cable 168. The priority logic network also has an output signal supplied on the line 160 to the memory cycle timing 162 which initiates each of the refresh cycles. The memory cycle timing unit 162, in response to the signals on the line 160, supplies an input on the line 164 to the memory interface to indicate that refresh cycle timing has begun.

The line 163 supplies a signal to the memory cycle timing unit 162 to distinguish refresh request signals from the other priority request signals on the lines 147. The line 48, as previously mentioned, signifies to the memory array control 27, that the signal on the cycle initiate line 160 was created by a refresh request. The line 47 signifies to the memory array control 27 that the cycle initiate signal on the line 160 was generated by one of the request lines 147. A signal is also supplied on the line 167 which indicates when the end of the refresh cycle has occurred, so that the priority logic network 146 may begin again to service the other requestors.

Figure 2:
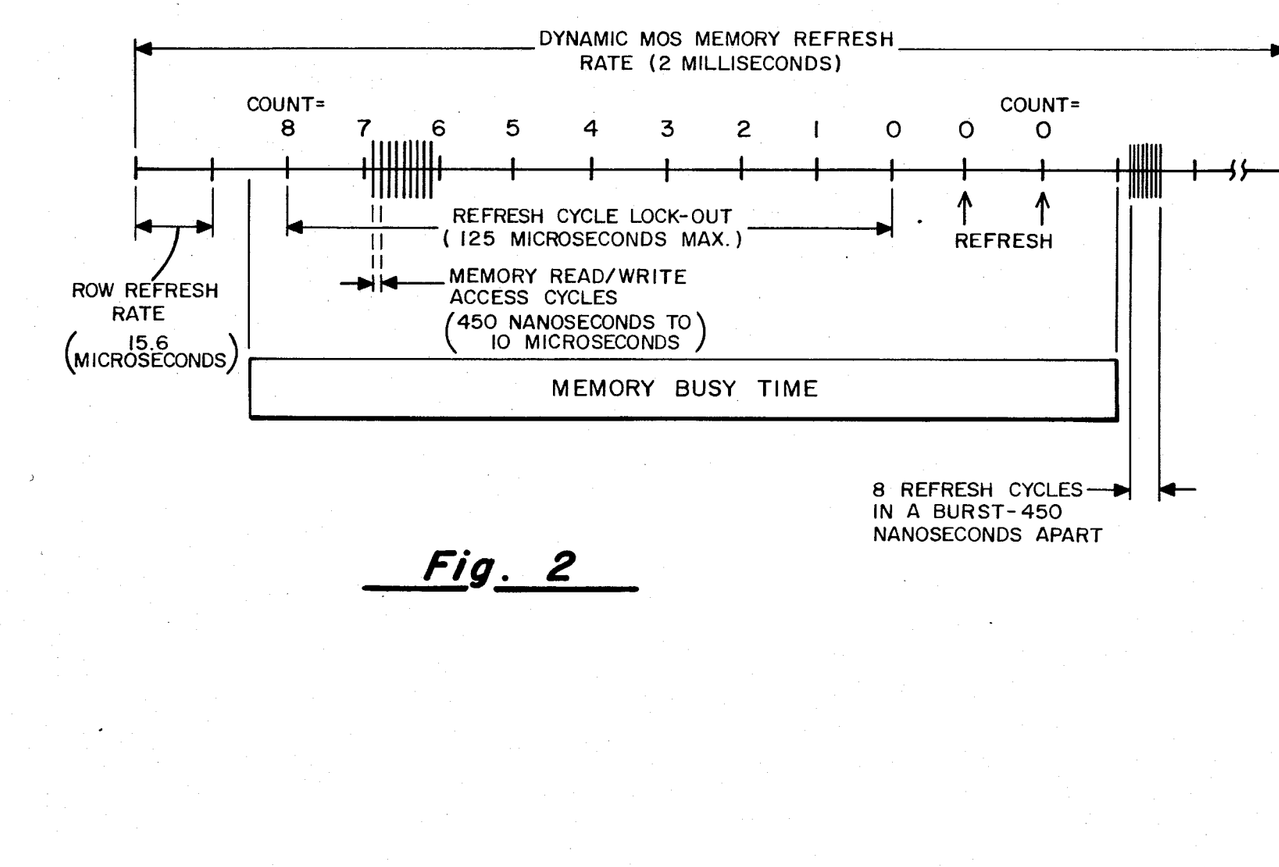
FIG. 2 is a timing system chart of the invention of FIGS. 1a-1c which represents the timing that is implemented in the described embodiment.

The request lines 147 are supplied also on the cable 170 to the memory interface 166. The memory interface is also interconnected to the address bus 22, the input data bus 24, the output data bus 26, and to the memory data array control bus 172, which is connected to the memory array control 27. The memory cycle timing unit 162, thus, supplies the signal on the line 48 which indicates to the memory array control that all of the lines 38, 40, 42 and 44 are energized with a high logic level signal, and that a burst of eight low pulses is to be supplied on lines 60 and 102. These pulses produce eight gating signals on the line 58, and up to eight rapid counting signals on the line 102 to provide up to eight refresh cycles in a burst which are 450 nanoseconds apart, as determined by the Clock 51, as shown in FIG. 2, where the burst is shown as occurring in the first 15.6 microsecond timing slot after the memory is no longer busy. If the memory becomes busy again before this burst of eight pulses is completed, the counter will stop counting at the count it has achieved, and will again begin counting down at 15.6 microsecond rate determined by the refresh counter 61. Therefore, at any time the counter 96 has counted down below "8", the line 129 will be at a high level and a refresh request signal will be initiated if none of the lines 147 are requesting access.

What is claimed is:

1. A refresh system for a dynamic memory comprising at least one memory bank having memory cells arranged in rows and columns that are all to be refreshed during a memory refresh rate period comprising, refresh timing means that repeatedly supplies a row refresh request at a row timing rate, which when multiplied by all of the rows of said memory to be refreshed equals a time period which is approximately equal to said memory refresh rate period, busy detect means which signals when said memory is currently busy due to said memory accessed for reading or writing, refresh supply means for supplying said row refresh request to groups of rows of said memory in a sequential cyclic manner to refresh said rows, wherein each group of rows comprises at least one row of said memory, refresh lock-out means responsive to said busy detect means which prevents said row refresh request from being supplied by said refresh supply means during a lock-out period that lasts for an integral number of row timing rate periods, up to a predetermined maximum number of periods, while said memory remains busy, and refresh burst timing means which supplies a burst of row refresh requests during a subsequent memory not busy burst interval to refresh a number or groups of said row up to said maximum number of consecutive row timing rate periods, which were locked-out from refresh by said refresh lock-out means during the time frame that proceeded said burst interval.

2. A refresh system as claimed in claim 1 wherein said memory is arranged into a plurality of banks and each of said groups of rows comprises the row of each of said banks.

3. A refresh system as claimed in claim 1 when said refresh burst timing means comprises an up/down directional counter that counts from one of its count limits to the other of its count limits in one direction in response to each row refresh request that occurs during a lock-out period, and in the other direction in response to the number of row refresh requests that occurs during a succeeding burst interval.

4. A refresh system as claimed in claim 3 wherein said memory is arranged into a plurality of banks and each of said groups of rows comprises at least one row of each of said banks.

* * * * *

UNITED STATES PATENT AND TRADEMARK OFFICE
CERTIFICATE OF CORRECTION

PATENT NO. : 4,691,303
DATED : 9/1/87
INVENTOR(S) : Reed R. Churchward, Thomas L. Krocheski It is certified that error appears in the above-identified patent and that said Letters Patent are hereby corrected as shown below:

Column 10, line 3, "proceeded" should be -- preceded -- .

Column 10, line 7, delete "the" and insert -- at least one -- .

Signed and Sealed this

Fourth Day of April, 1989

Attest:

DONALD J. QUIGG

Attesting Officer

Commissioner of Patents and Trademarks